United States Patent [19]

Kusunose

[11] Patent Number: 5,426,503
[45] Date of Patent: Jun. 20, 1995

[54] METHOD OF TESTING A PHASE SHIFT MASK AND A TESTING APPARATUS USED THEREIN IN THE ULTRAVIOLET WAVELENGTH RANGE

[75] Inventor: Haruhiko Kusunose, Hyogo, Japan

[73] Assignee: Mitsubishi Denki Kabushiki Kaisha, Tokyo, Japan

[21] Appl. No.: 314,257

[22] Filed: Sep. 30, 1994

[30] Foreign Application Priority Data

Oct. 12, 1993 [JP] Japan .................................. 5-254515
Sep. 1, 1994 [JP] Japan .................................. 6-208463

[51] Int. Cl.$^6$ ............................................. G01B 9/02
[52] U.S. Cl. ................................... 356/353; 356/354; 356/345; 250/372
[58] Field of Search ................. 356/345, 353, 354; 250/372

[56] References Cited

FOREIGN PATENT DOCUMENTS 57-62052  4/1982  Japan .
58-173744 10/1983 Japan .
3-181805  8/1991  Japan .
4-136854  5/1992  Japan .

OTHER PUBLICATIONS

"New Phase Shifting Mask with Self-Aligned Phase Shfiters for a Quarter Micron Photolithography", Nitayama et al, IEDM 89, pp. 57–60.
"Imaging Characteristics of Multi-Phase-Shifting and Halftone Phase-Shifting Masks", Terasawa et al, JJAP Series 5, pp. 3–9.
"Proceeding of 11th Meeting Japan Society for Laser Microscopy", Hyogo Prefectural Institute of Industrial research, Kobe, Japan, pp. 22–29.
"Interference Equipment for Transmitted-Light Microscopy", Beyer et al., Jena Review 10 (1965), pp. 99–105.
"Epival Interphako Incident-Light Interference Microscope", Beyer H. Jena Review 16, (1971), pp. 82–88.
"Problems Regarding a Micro Pattern Densitometer", Jun Koana, Transactions of the Society of Illumination 1942, pp. 371–385.

Primary Examiner—Samuel A. Turner
Assistant Examiner—Robert Kim
Attorney, Agent, or Firm—Lowe, Price, LeBlanc & Becker

[57] ABSTRACT

A method and apparatus are provided for obtaining accurately an amount of phase shift and light transmittance in a phase shift mask by a phase shifting portion. A shearing type Mach-Zehnder interferometer is constructed using an optical member for ultraviolet light. Using light having a wavelength identical to that of light used in photolithography, light transmitted through a phase shifting portion interferes with light transmitted through a light transmitting portion, resulting in an interference light intensity signal. From the interference light intensity signal, an amount of phase shifting and light transmittance of the phase shifting portion can be obtained directly and non-destructively.

7 Claims, 20 Drawing Sheets

FIG.5
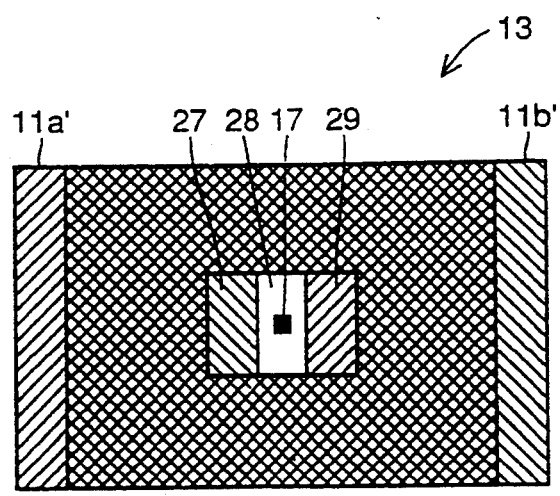
FIG.6(A)
FIG.6(B)
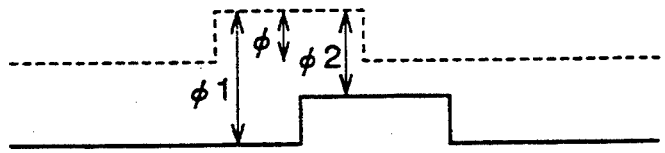

FIG. 14
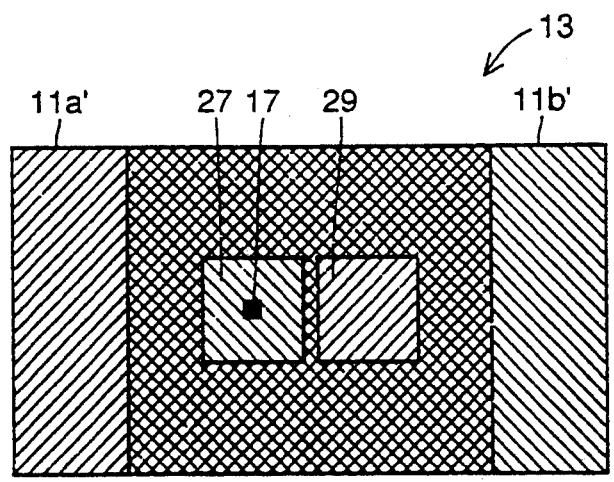
FIG. 15
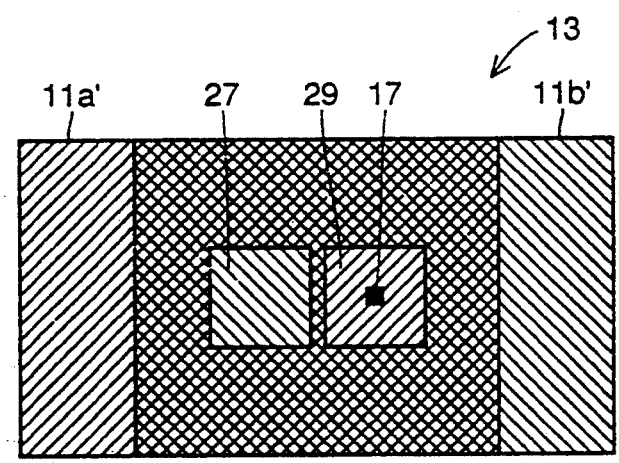
FIG. 16(A)
FIG. 16(B)
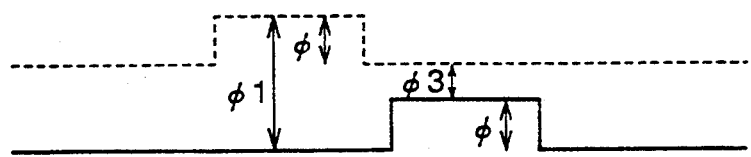

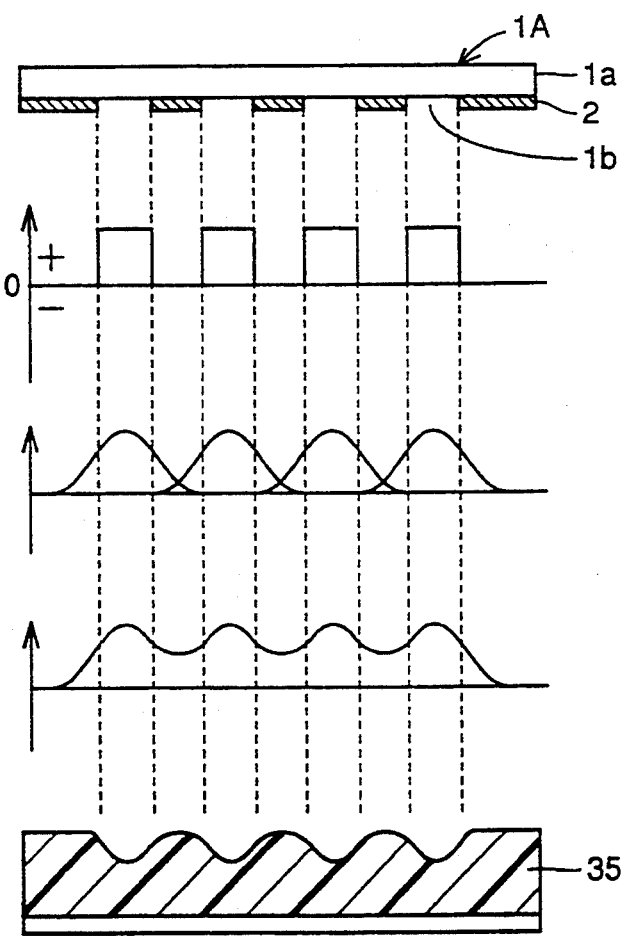

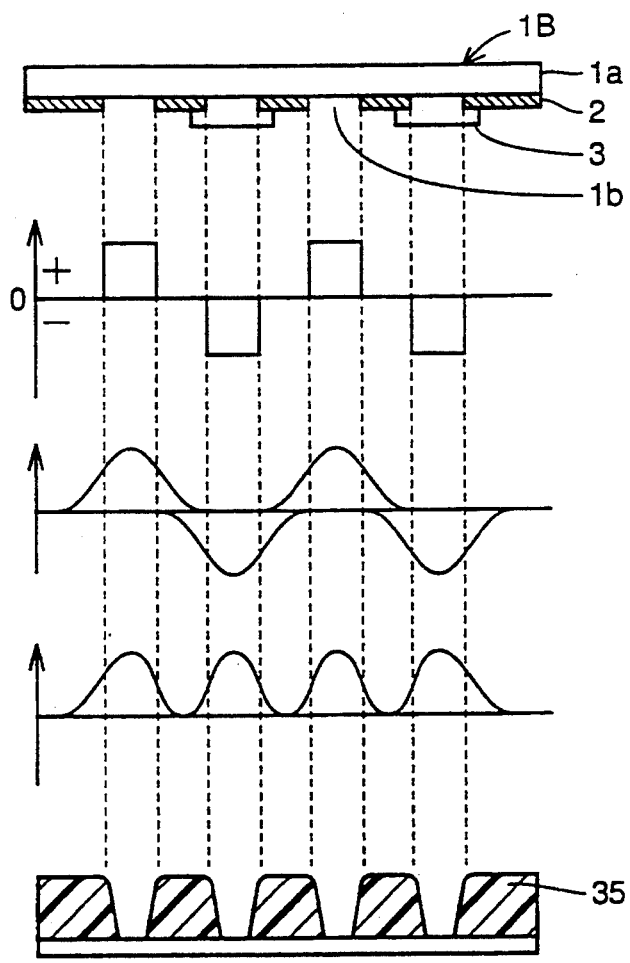

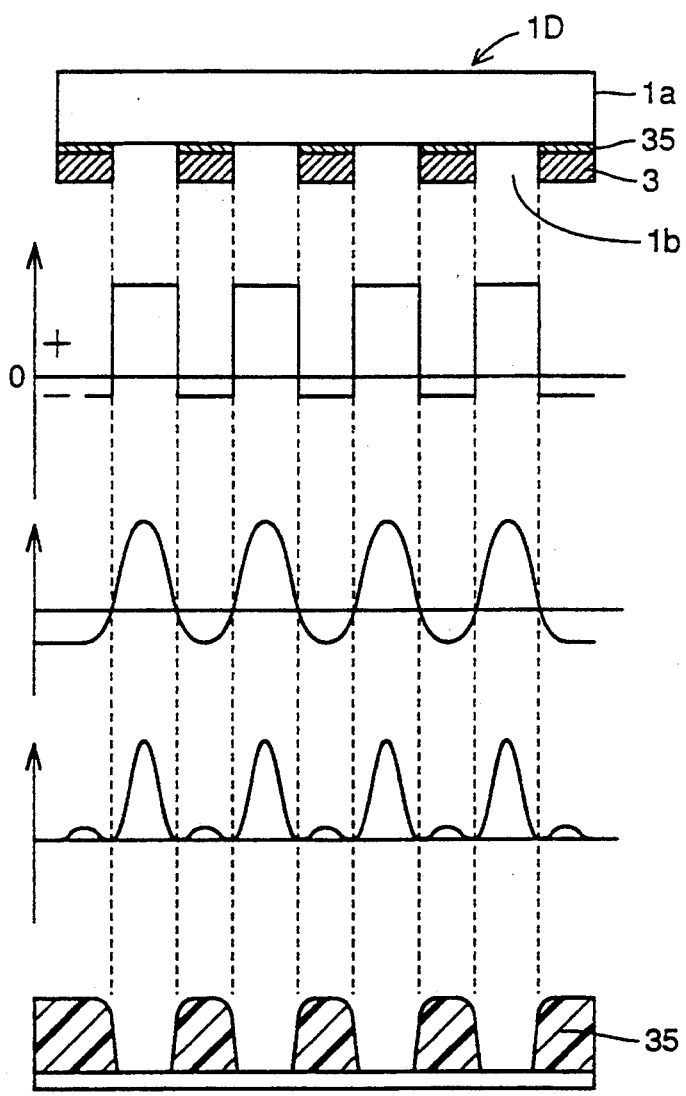

METHOD OF TESTING A PHASE SHIFT MASK AND A TESTING APPARATUS USED THEREIN IN THE ULTRAVIOLET WAVELENGTH RANGE

BACKGROUND OF THE INVENTION

1. Field of the Invention

The present invention relates to a method of testing a phase shift mask for photolithography used in manufacturing LSIs (Large Scale Integration) and a testing apparatus used in this method. Particularly, it relates to accurate measurement of the amount of phase shift and transmittance.

2. Description of the Background Art

Photographic techniques are well known for forming a desired LSI pattern on a semiconductor wafer using an optical stepper. An optical stepper is an exposure apparatus that reduces an enlarged pattern on a photomask onto a wafer for projecting the same in a step-and-repeat manner.

FIG. 22 schematically shows the main components of such an optical stepper. Referring to FIG. 22, an optical stepper includes a light source 31, a condenser lens 32, a demagnification lens 33, and an X-Y stage 34. Light emitted from light source 31 is directed onto a photomask 1 by condenser lens 32. Light transmitted through photomask 1 is projected onto a wafer 35 set on X-Y stage 34 by demagnification lens 33.

FIG. 23 shows an example of a conventional photomask used in an optical stepper. Referring to FIG. 23(A), a photomask 1A includes a transparent substrate 1a of flat glass or the like. A light shielding pattern such as of MoSi is formed on transparent substrate 1a. The material of light shielding pattern 2 is selected so that light used in photolithography can be blocked sufficiently. In photolithography, a g-line (wavelength $\lambda = 0.436$ $\mu$m) or an i-line ($\lambda = 0.365$ $\mu$m) which are emissions of a mercury lamp, or excimer laser can be used. Photomask 1A passes light only through light transmitting portions 1b.

FIG. 23(B) shows an electric field distribution of light just passing through photomask 1A. It can be seen that the electric field distribution exhibits a pattern of light transmitting portions 1b in fidelity right after light passes through photomask 1A.

If the distance between light transmitting portions 1b is reduced to improve the integration density of a LSI, the light amplitude on a semiconductor wafer 35 is as shown in FIG. 23(C). Because light transmitted through photomask 1A slightly bends laterally as a function of advance due to diffraction, light passing through two adjacent light transmitting portions 1b will interfere with each other. When two adjacent light transmitting portions 1b come closer to each other than a certain limit, the light intensity distribution can no longer define the two adjacent light transmitting portions 1b on a semiconductor wafer as shown in FIG. 23(D). This means that the pattern on photomask 1A is not resolvable. It is to be noted that the horizontal access in (C) and (D) in FIG. 23 is increased in scale to clarify the corresponding relationship with photomask 1A.

As shown in FIG. 23(E), the pattern on photomask 1A will not be produced in fidelity on wafer 35.

The resolution limit R of an optical stepper contributing to miniaturization of a LSI pattern is expressed by the following equation (1).

$$R = k \cdot \lambda / NA \quad (1)$$

The resolution of an optical stepper increases with a smaller value of resolution limit R. k is a constant dependent upon the photoresist process, and can be set as low as approximately 0.5. $\lambda$ represents the wavelength of light used for exposure, and NA represents the numerical aperture of the lens.

It can be understood from the above equation (1) that the resolution limit R is reduced (that is to say, the resolution is increased) by reducing constant k and wavelength $\lambda$, and increasing the numerical aperture NA of the lens. Because the maximum value of numerical aperture NA can be set to approximately 0.5 according to the current stage of art, the value of resolution limit R can be reduced to approximately 0.4 $\mu$m using an i line ($\lambda = 0.365$ $\mu$m).

In order to obtain a lower value of resolution limit R, numerical aperture NA should be further increased or light having a shorter wavelength $\lambda$ should be used. However, the design of a light source and a lens is technically difficult for this purpose. A depth of focus $\delta$, which is represented by the following equation (2), can be set to a lower value by reducing wavelength $\lambda$ and increasing numerical aperture NA to reduce resolution limit R.

$$\delta = \lambda / \{2(NA)^2\} \quad (2)$$

Thus, there was a problem that the resolution cannot be improved integrally. The usage of a phase shift mask is known in the prior art to avoid such a problem.

FIG. 24 shows a phase shift mask disclosed in Japanese Patent Laying-Open No. 58-173744, for example. The phase shift mask of FIG. 24(A) is similar to the photomask of FIG. 23(A) except for the provision of a phase shifting portion 3 formed of a transparent material such as $SiO_2$. A light transmitting portion 1b and a phase shifting portion 3 are disposed alternately. The phase of light passing through phase shifting portion 3 is shifted by 180° with respect to light passing through light transmitting portion 1b.

FIG. 24(B) shows the intensity distribution of an electric field by light right after passage through phase shift mask 1. The intensity distribution at the minus side shows that the phase is inverted with respect to the intensity distribution of the plus side.

FIG. 24(C) shows the amplitude of light on a wafer where light having the electric field distribution of FIG. 24(B) is projected. Light transmitted through the mask of FIG. 24(A) slightly expands laterally by diffraction, as in the case where light is transmitted through the mask of FIG. 23(A). However, light transmitted through the adjacent light transmitting portion 1b and phase shifting portion 3 have a relation of inverted phase with respect to each other. Therefore, the interference therebetween serves to cancel the light intensity. The light intensity pattern on the wafer can be identified even if the distance between light transmitting portion 1b and phase shifting portion 3 is reduced as shown in FIG. 24(D). The phase shifting mask 1B of FIG. 24 can have the minimum resolvable pattern width reduced to approximately a half in comparison with that of photomask 1A of FIG. 23 according to experiments.

As a result, the pattern on phase shift mask 1B is produced in fidelity on wafer 35 as shown in FIG. 24(E).

In phase shift mask 1B of FIG. 24, light transmitting portion 1b and phase shifting portion 3 must be disposed alternately. Although the phase shift mask of FIG. 24 can easily be adapted for simple and periodic patterns such as line patterns and space patterns, it is not suitable for complex patterns. It is difficult to improve the resolution in all regions of patterns having an arbitrary configuration.

A phase shift mask 1C applicable to arbitrary patterns and that can be manufactured easily is disclosed in IEDM (1989, pp. 57–60) by Nitayama et al. to solve the above problem. This phase shift mask can be formed by self-alignment. Referring to FIG. 25(A), a phase shifter 3 has a width larger than that of a light shield pattern 2. Therefore, light passing through the proximity of the edge of light shielding pattern 2 has its phase inverted by phase shifter 3, as shown in FIG. 25B. Therefore, the amplitude of light on wafer 35 is as shown in FIG. 25(C). As a result, phase shift mask 1C of FIG. 25(A) can realize a light intensity distribution on wafer 35 that closely corresponds to light transmitting portions 1b as shown in FIG. 25(D) whatever the pattern shape may be. Therefore, the pattern of phase shift mask 1c is produced in fidelity on wafer 35 as shown in FIG. 25(E).

An attenuation type phase shift mask is disclosed in JJAP Series 5 Proc. of 1991 Intern. Micro Process Conference Opp. 3–9 and in Japanese Patent Laying-Open No. 4-136854 as a phase shift mask applicable for arbitrary patterns and that can be easily implemented from the standpoint of the manufacturing process. FIG. 26 shows such an attenuation type phase shift mask. This attenuation type phase shift mask 1D includes a phase shifting portion of a double layered structure of a chromium layer 35 with a light transmittance of 5–40% and a shifter layer 3 providing a phase difference of 180° to the transmitting light, as shown in FIG. 26(A).

Light transmitting this phase shifter portion has its phase inverted and results in a light transmittance of 5–40%, as shown in FIG. 26(B). Therefore, the amplitude of light on wafer 35 is as shown in FIG. 26(C). Because the phase is inverted at the edge of the pattern, light intensity becomes 0 at the edge of the exposure pattern to allow high resolution. Therefore, attenuation type phase shift mask 1D of FIG. 26(A) allows a light intensity distribution accurately corresponding to light transmitting portion 1b to be realized on the wafer as shown in FIG. 26(D) regardless of the configuration of the pattern. Thus, the pattern of attenuation type phase shift mask 1D is produced in fidelity on wafer 35 as shown in FIG. 26(E).

Phase shift masks 1B, 1C and 1D are designed so that the phase difference between light transmitted through light transmitting portion 1b and light transmitted through phase shifting portion 3 is 180°. The effect of improving the resolution is degraded as the actual phase difference is offset from 180°. Therefore, it is necessary to test the actual amount of phase shift in the formation step of a phase shift mask. Conventional testing of the amount of phase shift in a shift mask includes the steps of measuring the refractive index and thickness of a phase shifting portion 3 and calculating the amount from the measured results.

When an ellipsometer (polarization diffracting device) is used for measurement, the refractive index cannot be measured because reflection from the substrate boundary is too low due to the formation of a phase shifting portion 3 on a transparent substrate 1a. In practice, the refractive index of the phase shifter formed on a substrate such as of silicon is measured. However, the produced transparent substrate of the phase shift mask and the silicon substrate differ in material. Therefore, the quality of the film of the phase shifter formed on these substrates also differ, giving rise to the problem that the refractive index is different.

When a needle type profilometer is used to measure the thickness of a phase shifter, those having the practical pattern interval of approximately 1 μm–2 μm cannot be measured due to the limitation of the size of the needle tip. In determining the thickness of a phase shifter with such a needle type profilometer, a coarse pattern for the purpose of measurement is formed, and the thickness of the phase shifter included in that pattern is measured. However, the thickness of the phase shifter on the actual pattern cannot be identified if the thickness of the shifter included in the pattern of the actual phase shift mask differs from the thickness of the phase shifter included in the coarse pattern formed for measurement.

Takahiro Ode discloses a phase shift amount measurement device of optical heterodyne method in pp. 22–29 in *Proceedings of 11th Meeting of Japan Society for Laser Microscopy* (1993). This phase shift amount measurement device uses an HeNe laser as a light source having a wavelength of 0.633 μm. An HeNe laser having such a long wavelength is not used in the photolithographic step using a phase shift mask. The refractive index of a phase shifter measured with an HeNe laser differs from the refractive index of ultraviolet light of, for example, 0.365 μm in wavelength used in photolithography. Because ultraviolet light cannot be used as a light source in an optical heterodyne phase difference measurement device, there was a problem that the phase difference in a phase shift mask cannot be obtained accurately for ultraviolet light that is used in photolithography.

In the case of a signal processing system using a shearing system Mach-Zehnder interferometer of a shearing type for visible light as shown in *JENA REVIEW* 10 (1965) 99–105, "Interferenzeinrichtung fur Durch lichtmicroskopie" Beyer, H. and Shoppe, G. and *JENA REVIEW* 16 (1971) 82–88 Special Fair Issue "Auflicht-Interferenzmicroscop EPIVAL interphako" Beyer, H., the refractive index of the phase shift pattern material of the phase shift mask differs from the refractive index at the wavelength of 365 nm, for example, which is actually use for exposure since the wavelength of light used for measurement of the amount of phase shift is within the visible light range.

Thus, there was the problem that the amount of phase shift of the phase shift pattern material could not be obtained with a wavelength that is actually used for exposure. Furthermore, because the above-described signal processing system uses a homodyne system, a correct amount of phase shift cannot be obtained if only a weak interference beam is obtained.

In Japanese Patent Laying-Open No. 3-181805, a shifter film thickness measurement apparatus is disclosed of a phase shift mask having a sample disposed in the optical path of the Mach-Zehnder interferometer. This shifter film thickness measurement apparatus will be described schematically with reference to FIG. 27. Referring to FIG. 27, light emitted from a white light source 48 is rendered into parallel rays by a lens 56 to be diverged into an optical path 46A and an optical path 46B by a half mirror 46a. Optical path 46A passing through a shifting portion 56 of a phase shift mask 52 is restored into parallel rays by a lens 56b after transmitting through a shifting portion 59 as a spot light from lens 56a. Optical path 46A with the parallel rays are combined with optical path 46B by a half mirror 46c via a wedge-like glass 49 for course adjustment and a half mirror 46b. Wedge-like glass 49 is provided for course adjustment when optical path 46A deviates from optical path 46B in the optical path length.

The diverged light is incident into a detector 45a by half mirror 46b. By this detector 45a that detects light intensity, light shielding patterns and detective portions of light transmitting portions can be identified. The light diverged by half mirror 46a and reflected by a mirror 47 passes through a dummy glass substrate 54 and a wedge-like glass 50 for fine adjustment, so that optical path 46B is combined with optical path 46A by half mirror 46c. Dummy glass substrate 54 serves to approximate the optical path length of optical path 46B to that of optical path 46A, and has a thickness identical to that of the glass substrate of phase shift mask 52. Wedge-like glass 50 is controlled to be fine-moved by a pulse motor 51.

In a shifter film thickness measurement apparatus of the above-described structure, pulse motor 51, light interference signal detector 45a, and an X-Y stage 53 that moves light intensity detector 45b and phase shift mask 52 vertically and horizontally are controlled by a control device 44, whereby the presence and film thickness of shifting portion 59 is measured. The pattern configuration of the phase shift mask is also detected.

In the above-described shifter film thickness measurement apparatus, interference is low since white light source 48 is used. An interference waveform cannot be obtained when there is difference in the optical path length within the interference portion of the interferometer. It is therefore necessary to prepare a dummy glass substrate 54 having a thickness identical to that of the sample. There is also a problem that the phase at a wavelength that is actually used for wafer exposure cannot be measured accurately since white light source 48 is used.

A difference in length between the two optical paths is generated due to tremble in the air inside the interferometer or due to the vibration of the components forming the interferometer, resulting in a swing in the intensity of the interference signal. It is desirable to suppress the deviation in the difference between the two optical path length to less than approximately $\lambda/1000$. To satisfy this limit, a structure that blocks the exterior environment and an anti-vibration mechanism are required. However, even if the air is completely sealed, insertion and removal of the phase shift mask and the dummy glass substrates and movement of X-Y stage 53 for pattern positioning at the time of measurement cannot be avoided, resulting in tremble in the air inside the interferometer. Thus, it is difficult to suppress the internal turbulence to less than $\lambda/1000$.

In using an attenuation type phase shift mask, the phase shift pattern has a light transmittance selected from the range of approximately 5-40%. However, when this light transmittance is offset from the designed value, for example when the light transmittance is too low, the role as a phase shift mask is deteriorated to approximate the characteristics of a photomask having the general light shielding pattern. If the light transmittance is too high, light will leak from regions which actually should shield light, resulting in a fog phenomenon. It is therefore necessary to set an appropriate value of the light transmittance for the phase shift pattern.

As shown in "Problems Regarding a Micro Pattern Densitometer" in *Transactions of the Society of Illumination* 1942, light transmittance measurement of fine patterns involved a phenomenon called Schwarzschild-Villiger effect. More specifically, there is a great error in the measured value due to stray light caused by reflection of light between the surface of the objective lens and the phase shift mask, and by reflected light within the objective lens. This phenomenon will be described hereinafter with reference to FIG. 28.

Referring to FIG. 28, an objective lens 4 and a light source 39 are disposed beneath an attenuation type phase shift mask 1. An optical system 4, a barrier wall 37 with a small opening, and a light receiver 36 are provided above attenuation type phase shift mask 1.

The light beam indicated by a solid line in the drawing implies light transmitting through a normal optical path. The light beam indicated by dashed lines implies stray light reflected by objective lens 4 and the surface of attenuation type phase shift mask 1 to enter light receiver 36.

In measuring the amount of phase shift in a micro phase shift pattern, there are cases the measure value differs from the actual amount of phase shift due to wavefront aberration by defocus with respect to the phase shift mask. This state is shown in FIG. 29. It is appreciated from FIG. 29 that wavefront 40 of the diffractive light from the peripheral patterns causes gradual increase in aberration 43 as being offset from focus 41 with respect to wavefront 44 of zero degree of the pattern to be measured.

SUMMARY OF THE INVENTION

In view of the foregoing, an object of the present invention is to provide a method of obtaining accurately the amount of phase shift and the light transmittance by a phase shifter on a phase shift mask for ultraviolet light that is actually used in photolithography, and an apparatus used in this method.

According to an aspect of the present invention, a method of testing a phase shift mask includes the following steps. First, ultraviolet light is directed to a phase shift mask including a phase shifting portion and a light transmitting portion. The ultraviolet light transmitted through the phase shift mask is divided into a first light beam passing through a first optical path and second light beam transmitting through a second optical path.

Then, a relative difference in optical path length is generated between the first and second optical paths using an optical wedge. The first and second light beams are superimposed to form an interference beam. A photometric target is positioned at the region where a phase shifting portion transmitting region of the first beam and a light transmitting portion transmitting region of the second light beam of the interference are superimposed.

Using the photometric target, a first light intensity signal is measured according to an interference beam depending upon change in the optical path length difference by a first movement of the optical wedge. Then, the photometric target is positioned at a region where the transmitting regions of the light transmitting portion of the first light beam and light transmitting portion of the second light beam of the interference beam are superimposed.

A second light intensity signal is measured using the photometric target according to an interference beam depending upon change in the optical path length difference by a second movement of the optical wedge. The optical characteristics of the phase shift mask is obtained on the basis of the first light intensity signal and the second light intensity signal.

Therefore, the tremble in air caused by exchange or movement of the phase shift mask or other external environment is identical in the first and second optical paths. As a result, precise first and second light intensity signals can be obtained, allowing testing of the optical characteristics of the phase shift mask at high accuracy.

Preferably, the step of obtaining the optical characteristics of a phase shift mask includes the steps of: obtaining a first pitch ($t_1$) between maximal points of the first light intensity signal; obtaining a second pitch ($t_2$) between maximal points of the second light intensity signal; and dividing the first pitch ($t_1$) by the second pitch ($t_2$) and multiplying that quotient by $2\pi$ to obtain the amount of phase shift ($\phi$) of the phase shifting portion.

More preferably, the step of obtaining the optical characteristics of a phase shift mask includes the steps of: obtaining a first interference beam intensity amplitude ($B_1$) of the first light intensity signal; obtaining a second interference beam intensity amplitude ($B_2$) of a second light intensity signal; dividing the first interference beam intensity amplitude ($B_1$) by the second interference beam intensity amplitude ($B_2$), multiplying that quotient by itself, and then multiplying this squared value by a light transmittance ($T_2$) of the light transmitting portion to obtain a light transmittance ($T$) of the phase shifting portion.

Therefore, stray light caused by reflectance between the phase shift mask and the objective lens and within the objective lens does not affect the first and second light intensity signals since it lacks interference with respect to light passing through a normal optical path in comparison with the case where light transmittance is measured using intensity of transmitted light of the phase shifting portion. Thus, light transmittance can be obtained at a very accurate level.

More preferably, in the step of measuring the second light intensity signal, the second movement range of the optical wedge is smaller by two or more periods with respect to the first movement range. The step of obtaining the optical characteristics of a phase shift mask includes the steps of: obtaining a cross correlation function of the first and second light optical signals; obtaining the period of the light intensity signal from the distance between a first maximal point most closest to the center of the cross correlation function and a second maximal point that is next closest to the center of the cross correlation function; dividing the distance between the center point and the first maximal point by the period and multiplying that quotient by $2\pi$ to obtain the amount of phase shift of the phase shifting portion from the first and second light intensity signals.

Thus, an accurate phase difference can be obtained even when the first and second light intensity signals are weak signals.

According to another aspect of the present invention, a method of testing a phase shift mask includes the following steps.

A phase shift mask including a phase shifting portion and a light transmitting portion is irradiated with ultraviolet light. The ultraviolet light transmitted through the phase shift mask is divided into a first light beam passing through a first optical path and a second light beam passing through a second optical path.

A relative optical path length difference is generated between the first and second optical paths using an optical wedge. The first and second light beams are superimposed to form an interference beam. Then, a photometric target is positioned at a region where the transmitting regions of the phase shifting portion of the first light beam and the light transmitting portion of the second light beam of the interference beam are superimposed.

Using the photometric target, a first light intensity signal is measured according to the interference beam depending upon change in the optical path length difference by a first movement of the optical wedge. Then, the optical target is positioned at a region where the transmitting regions of the light transmitting portion of the first light beam and the phase shifting portion of the second light beam are superimposed.

Using the photometric target, a second light intensity signal is measured according to the interference light depending upon change in the difference of the optical path length by a second movement of the optical wedge. Optical characteristics of the phase shift mask is obtained according to the first and second light intensity signals.

Therefore, tremble in air caused by exchange and movement of a phase shift mask and by external environment is identical in the first and second optical paths. As a result, accurate first and second light intensity signals can be obtained, allowing testing of optical characteristics of a phase shift mask at high accuracy.

According to a further aspect of the present invention, a method of testing a phase shift mask includes the following steps.

Ultraviolet light is directed to a phase shift mask including a phase shifting portion and a light transmitting portion. The ultraviolet light transmitted through the phase shift mask is divided into a first light beam passing through a first optical path and a second light beam passing through a second optical path.

A relative difference in optical path length is generated between first and second light paths using an optical wedge. The first and second light beams are superimposed to form an interference beam. A photometric target is positioned at a region where the transmitting regions of the phase shifting portion of the first light beam and the light transmitting portion of the second light beam of the interference beam are superimposed.

Using the photometric target, the optical wedge is driven by more than 1 wavelength, and a first light intensity signal is measured according to an interference beam depending upon change in the difference of the optical length. Then, a Fourier transform is applied on the first light intensity signal when the length of the first light intensity signal is varied within a range of approximately 1 wavelength, to measure a first power spectrum.

Then, a first SN ratio is obtained by the first power spectrum. By obtaining the maximum point of the first SN ratio, Fourier transform is carried out for the period range of the first light intensity signal, wherein a first angle ($\phi_1$) and a first vector length ($B_1$) in the polar coordinates of the found first complex vector are obtained.

Then, a photometric type is positioned at a region where the transmitting regions of the light transmitting portion of the first light beam and the light transmitting portion of the second light beam are superimposed. Using this photometric target, the optical wedge is driven by 1 or more wavelengths, and a second light intensity signal is measured according to the interference beam depending upon change in the difference of the optical path length.

Fourier transform is applied on the second light intensity signal when the length of the second light intensity signal is varied in the range of approximately 1 wavelength, whereby a second power spectrum is measured. Then, a second SN ratio is obtained by the second power spectrum.

Then, Fourier transform is carried out for the range of the period of the second light intensity signal by obtaining the maximum point of the second SN ratio, and a second angle ($\phi_2$) and a second vector length ($B_2$) are obtained of the polar coordinates of the found second complex vector. The amount of phase shift ($\phi$) of the phase shifting portion is obtained according to the difference between the first and second angles ($\phi_1$ and $\phi_2$).

The first vector length ($B_1$) is divided by the second vector ($B_2$), the quotient is multiplied by itself, and then the squared value is multiplied by a light transmittance ($T_2$) of the light transmitting portion to obtain a light transmittance of the phase shifter portion.

Thus, an accurate phase difference can be obtained even if the first and second light intensity signals are weak signals.

An apparatus for testing a phase shift mask according to the present invention includes: a light source emitting ultraviolet light; a phase shift mask supporting unit including a phase shifting portion and a light transmitting portion for supporting a phase shift mask through which ultraviolet light is transmitted; an ultraviolet light diverging unit for dividing the ultraviolet light transmitted through the phase shift mask into a first light beam passing through a first optical path and a second light beam passing through a second optical path; a superimposing unit for superimposing the first and second light beams to form an interference beam; and a testing unit for testing optical characteristics of the phase shift mask according to the optical characteristic of the interference beam. In the first and second optical paths, there are provided an optical path length adjusting unit for adjusting the relative relationship between the first optical path length and the second optical path length; and a shearing unit for generating a predetermined deviation between a pattern image of the phase shift mask of the first light beam and a pattern image of the phase shift mask of the second light beam at the superimposition of the first and second light beams.

Therefore, tremble in the air caused by exchange and movement of the phase shift mask and external environment is identical in the first and second optical paths.

Furthermore, a phase shift mask and a dummy mask do not have to be inserted in the first and second optical paths, so that precision of the measurement of the apparatus can be improved. Furthermore, the size of the testing apparatus can be reduced regardless of the size of the phase shift mask.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a second schematic diagram showing a wavefront of an interference beam according to a method of testing a phase shift mask of the present invention.

FIG. 6 is a first schematic diagram showing the wavefront relationship between first and second light intensity signals.

FIG. 14 is a first diagram showing a state of an interference beam in a method of testing a phase shift mask according to another embodiment of the present invention.

FIG. 15 is a second diagram showing a state of an interference beam in a method of testing a phase shift mask according to another embodiment of the present invention.

FIG. 16 is a second schematic diagram showing the relationship between first and second light intensity signals.

FIG. 23 shows a sectional view of a structure of a photomask (A); an electric field on a photomask using the photomask of (A) (B); amplitude of light on a resist film using the photomask of (A) (C); light intensity on a resist film using the photomask of (A) (D); and a sectional view of a transfer pattern onto a resist film using the photomask of (A) (E).

FIG. 24 shows a sectional view of a structure of a phase shift mask (A); an electric field on a photomask using the phase shift mask of (A) (B); amplitude of light on a resist film using the phase shift mask of (A) (C); light intensity on a resist film using the phase shift mask of (A) (D); and a sectional view of a pattern transferred onto a resist mask using the phase shift mask of (A).

FIG. 26 shows a sectional view of a structure of an attenuation type phase shift mask (A); an electric field on a photomask using the attenuation type phase shift mask of (A) (B); amplitude of light on a resist film using the attenuation type phase shift mask of (A) (C); light intensity on a resist film using the attenuation type phase shift mask of (A) (D); and a sectional view of a pattern transferred onto a resist mask using the attenuation type phase shift mask of (A).

DESCRIPTION OF THE PREFERRED EMBODIMENTS

Figure 1:
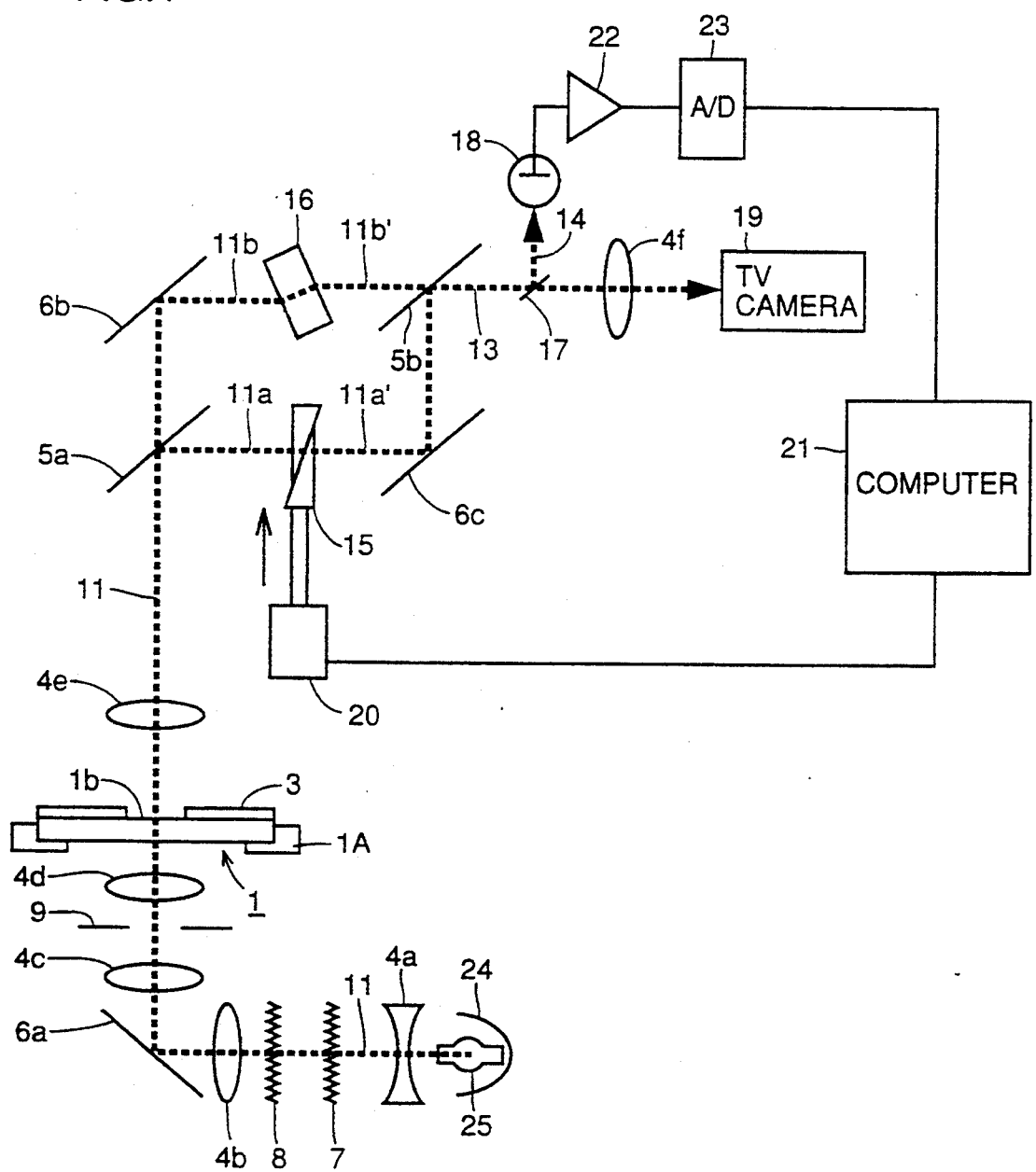
FIG. 1 is a block diagram showing a measurement state according to a method of testing a phase shift mask of the present invention.

FIG. 1 is a block diagram schematically showing an apparatus used in the method of testing a phase shift mask according to an embodiment of the present invention. In this apparatus, a light beam 11 emitted from a mercury lamp 25 is gathered towards a lens 4a by a cold mirror 24. The light transmitting member of the lens or the like is formed of quartz, for example, having high transmittance with respect to ultraviolet light. Cold mirror 24 is a mirror that selectively reflects light having a short wavelength such as ultraviolet light. Light beam 11 reflected by cold mirror 24 is made parallel by lens 4a, and then converted into an ultraviolet beam having a single wavelength by a cold filter 7 and an interference filter 8. Cold filter 7 is a filter that selectively transmits light having a short wavelength. This selected single wavelength is identical to the wavelength of the light used in an optical stepper, and 0.365 μm or 0.436 μm, for example, is selected. The beam of a single wavelength is reflected upwards by a total reflection mirror 6a after transmitting through a lens 4b. It is to be noted that only light beam 11 is shown in the figure.

Figure 2A:
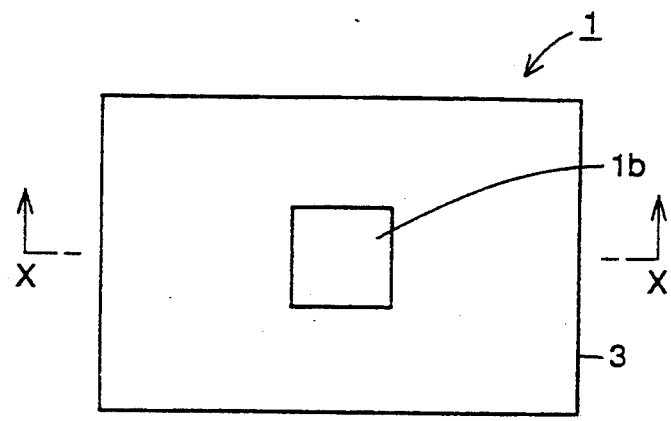
FIG. 2A is a plan view of an attenuation type phase shift mask.
Figure 2B:
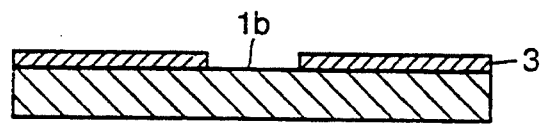
FIG. 2B is a sectional view taken in the direction of the arrow of line X—X in FIG. 2A.

Light beam 11 reflected by total reflection mirror 6a passes through a lens 4c, an aperture diaphragm 9, and a lens 4d to enter phase shift mask 1. Phase shift mask 1 includes a light transmitting portion 1b and a phase shifting portion 3 as shown in FIGS. 2A and 2B. FIGS. 2A and 2B are a plan view and a sectional view, respectively, of phase shift mask 1.

Referring to FIG. 1 again, light beam 11 transmitted through phase shift mask 1 is enlarged by a lens 4e and then divided by a half mirror 5a. A portion of light beam 11 is reflected rightwards to form a first light beam 11a. A light beam 11b passing through half mirror 5a is reflected rightwards by a total reflection mirror 6b. Light beam 11b reflected by total reflection mirror 6b has its optical path shifted latterly by an optical shearing member 16. Light beam 11a reflected by half mirror 5a passed through an optical wedge 15 to have its optical path length adjusted. Light beam 11a' passing through optical wedge 15 is reflected by total reflection mirror 6c towards a half mirror 5b.

Figure 3:
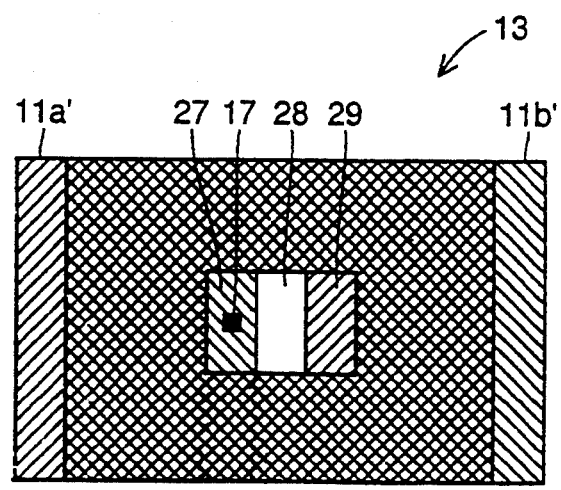
FIG. 3 is a first schematic diagram showing a wavefront of an interference beam according to a method of testing a phase shift mask of the present invention.

Light beam 11b' passing through optical shearing member 16 and light beam 11a' passing through optical wedge 15 are combined by half mirror 5b to become an interference beam 13. The wavefront of interference beam 13 is as shown in FIG. 3. Optical shearing member 16 changes the position of light beam 11a' so that the two light beams of 11a' and 11b' passing through different regions of light transmitting portion 1b and phase shifting portion 3 can be combined to allow interference. Interference beam 13 will have an intensity depending upon the phase difference between the two light beams 11a' and 11b'.

A portion of interference beam 13 is totally reflected upwards by a photometric target 17 to enter a photo multiplier 18. Photo multiplier 18 provides a current according to the intensity of incident light to a current-/voltage conversion amplifier 22. Current/voltage conversion amplifier 22 converts an input current into a voltage output. This voltage output is converted into a digital value by an A/D converter 23 to be applied to a computer 21. Computer 21 stores an intensity signal of interference beam 13 as a digital signal into a memory.

The remaining interference beam 13 passes through the outside of photometric target 17 to be projected on a television camera 19 for ultraviolet light through a lens 4f. An user can observe the measured portion on a television screen (not shown). The portion corresponding to photometric target 17 is observed as a dark spot on the television screen. Positioning of the portion to be measured of phase shift mask 1 can be carried out from the relationship between the dark spot and the projected mask pattern.

As shown in FIG. 3, a photometric target 17 is positioned at region 27 where transmitting regions of the phase shifting portion of light beam 11a' and the light transmitting portion of light beam 11b' of interference beam 13 are superimposed.

Optical wedge 15 is moved by a linear drive mechanism 20 controlled by computer 21. By moving optical wedge 15 as shown by the arrow in the drawing, the optical path length of light beam 11a' can be varied, whereby the phase of light beam 11a' can be relatively changed with respect to light beam 11b'. The intensity of interference beam 13 changes depending upon this change in phase. The first intensity I of interference beam 13 can be represented by the following equations of (3)–(5).

$$I = A_1^2 + A_2^2 + 2A_1A_2 \cos(\phi_1 - \phi_2 + p) \qquad (3)$$

$$\phi_1 - \phi_2 = \phi \qquad (4)$$

$$p = 2\phi tM/\lambda \qquad (5)$$

$A_1$ and $A_2$ represent the amplitudes of light beam $11a'$ and $11b'$, respectively. $\phi_1$ and $\phi_2$ represent the phases of light beams $11a'$ and $11b'$ right after passing through phase shifting portion 3 and light transmitting portion $1b$, respectively. $\phi$ represents the difference between phases $\phi_1$ and $\phi_2$, i.e. the amount of phase shift by phase shift portion 3. p represents the amount of phase shift generated by the difference in the optical paths of light beams $11a'$ and $11b'$. $\lambda$ represents the wavelength of measured light, and t represents the position of optical wedge 13. M represents the changing rate of an optical path difference with respect to the moved distance of optical wedge 13.

Light intensity I provided by equation (3) changes in a sinusoidal wave manner with respect to the change of value p. Light intensity I shows a maximal value when $\phi_1 - \phi_2 + p = 2m\pi$ (m is an integer), and a minimal value when $\phi_1 - \phi_2 + p = (2m-1)\pi$.

Figure 4:
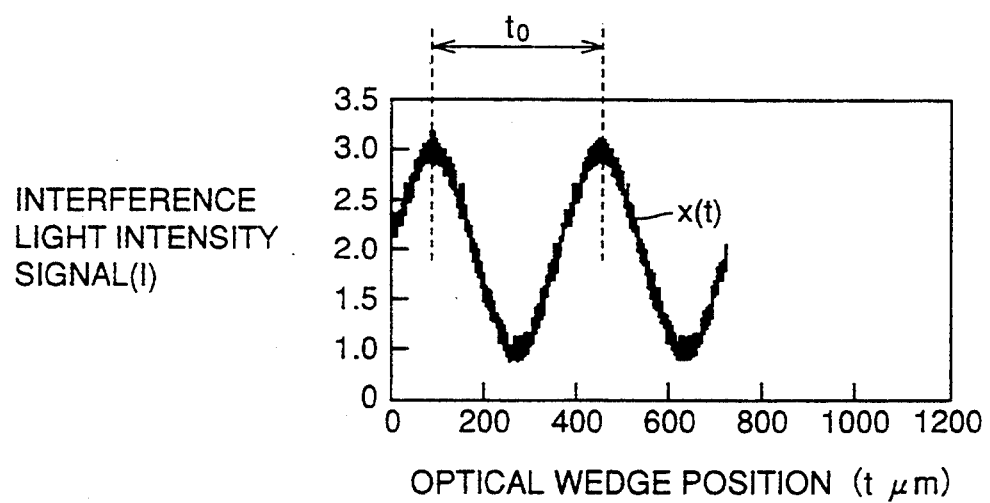
FIG. 4 is a graph showing interference light intensity signal obtained by the measurement shown in FIG. 1.

FIG. 4 is a graph showing the change in intensity of interference beam 13 obtained by the measurement of FIG. 3. In this graph, the position of optical wedge 15 is plotted along the abscissa, and light intensity I is plotted along the ordinate in an arbitrary unit. Interference light intensity signal x(t) in FIG. 4 is obtained using an i line ($\lambda = 0.365$ $\mu$m) of a mercury lamp as measurement light, and moving optical wedge 15 of $M = 1/1000$ at a pitch of 1 $\mu$m. The length of 1 period $t_0$ in FIG. 4 is obtained as the interval between two adjacent maximal points in light intensity signal x(t).

As shown in FIG. 5, X-Y stage 1A is moved to position photometric target 17 at a region 28 where the transmitting regions of a light transmitting portion of first light beam $11a'$ and a light transmitting portion of second light beam $11b'$ are superimposed.

This obtained second light intensity I' is expressed by the following equation of (6).

$$I' = A_2^2 + A_2^2 + 2A_2A_2 \cos(\phi_2 - \phi_2 + p) = 2A_2^2 (1 + \cos p) \quad (6)$$

FIG. 6 shows the relationship of the measurement position with respect to the wavefront of light transmitted through phase shift mask 1 according to this measurement. FIG. 6, a wavefront 1 indicates the wavefront of first light beam $11a'$, and a second wavefront 2 shows the wavefront of second light beam $11b'$.

Because amplitude $A_2$ of light passing through the light transmitting portion is constant, I' is a function of a only a phase shift amount p of light beams $11a'$ and $11b'$ within the testing apparatus in equation (6).

Figure 7:
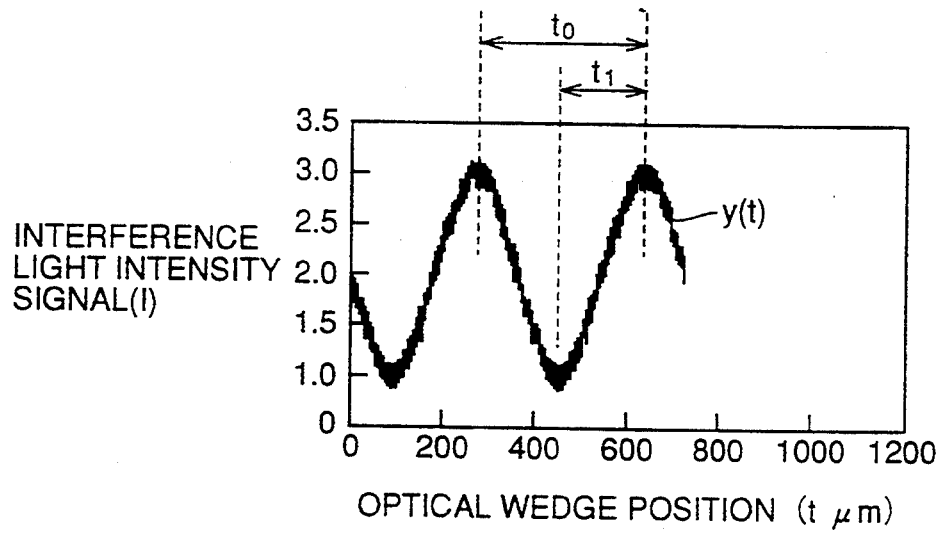
FIG. 7 is a graph showing an interference light intensity signal according to the present invention.

FIG. 7 is a graph similar to that of FIG. 4, indicating interference light intensity of signal y(t) measured according to FIG. 5. For the sake of illustration simplicity, the amount of phase shift $\phi$ according to phase shift portion 3 is set to $\pi$ in FIGS. 4 and 7. The relationship of x(t), y(t), $t_0$ and $t_1$ is represented by the following equations (7) and (8).

$$x(t) = x(t + nt_0) \quad (7)$$

$$y(t) = x(t + nt_1) \quad (8)$$

n represents an integer. $t_0$ represents the moved amount of optical wedge 15 corresponding to 1 period of light intensity signals x(t) and y(t). $t_1$ represents the moved amount of optical wedge 13 corresponding to the amount of phase shift of light intensity signals x(t) and y(t).

From the foregoing, the amount of phase shift $\phi$ between the light beam transmitted through phase shifting portion 3 and the light beam transmitted through light transmitting portion $1b$ is indirectly expressed by the following equation (9).

$$\phi = 2\pi t_1/t_0 \quad (9)$$

A method of obtaining light transmittance will be described hereinafter. Light transmittance T is expressed by the following equation.

$$T = T_2 A_1^2 / A_2^2 \quad (10)$$

where $A_1$ represents amplitude of the light beam passing through phase shifting portion 3, $A_2$ represents amplitude of the light beam passing through the light transmitting portion, and $T_2$ represents the light transmittance of the light transmitting portion. Generally, a quartz substrate is used for the light transmitting portion, so that the light transmittance becomes 92.5% in this case for ultraviolet light of 365 nm, for example.

Assuming that B represents the value of equation (3) excluding the DC component, i.e. amplitude of a sinusoidal signal, $B_2$ represents the light intensity amplitude when light passing through light transmitting portions are interfered with each other, and $B_1$ represents light intensity amplitude when light passing through a phase shifting portion interferes with light passing through a light transmitting portion, $A_1$, $A_2$, $B_1$ and $B_2$ can be represented by the following equations.

$$B_1 = 2A_1A_2 \quad (11)$$

$$B_2 = 2A_2A_2 \quad (12)$$

Therefore, the following equation can be provided by equations (10), (11) and (12).

$$T = T_2(B_1/B_2)^2 \quad (13)$$

Embodiment 2

In the testing apparatus of FIG. 1, an optical member of lens is used having high transmittance with respect to ultraviolet light.

When an optical member for visible light is used in a testing apparatus, it is difficult to obtain a sufficient SN ratio because the amplitude of an intensity signal of interference beam 13 becomes too small due to ultraviolet light being absorbed or reflected by the optical member. This means that the position of the maximal point of an obtained light intensity signal is not accurate. In this case, the phase difference detection accuracy can be improved by carrying out a signal process set forth in the following.

Figure 8:
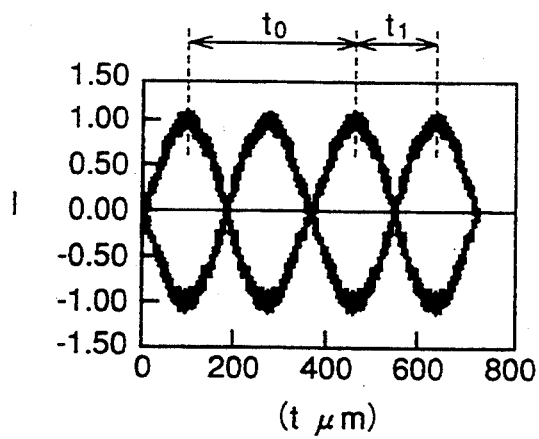
FIG. 8 is a graph showing an interference light intensity signal of a low S/N ratio.

FIG. 8 shows light intensity signals x(t) and y(t) having an SN ratio lower that of FIGS. 4 and 7. Referring to FIG. 8, light intensity I plotted along the ordinate has the average intensity subtracted. Regarding such light intensity signals x(t) and y(t), a cross correlation function of the following equation (14) is obtained.

$$R_{xy}(u) = \int_{-\infty}^{+\infty} x(t) y(u+d) \, dt \quad (14)$$

Figure 9:
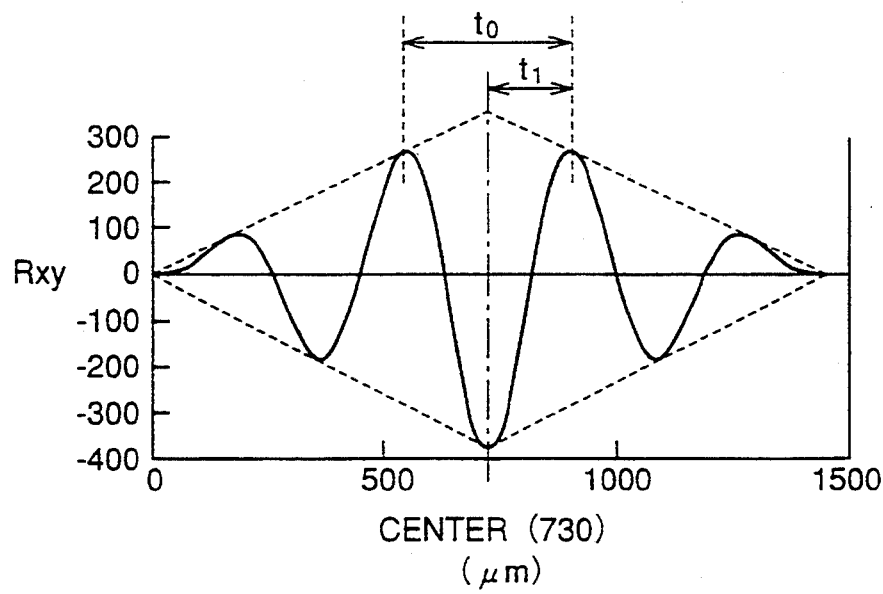
FIG. 9 is a graph showing cross correlation functions obtained from the two interference light intensity signals of FIG. 8.

$R_{xy}(u)$ represents a cross correlation function, and u represents a variable of a cross correlation function. FIG. 9 is a graph showing a cross correlation function obtained with respect to light intensity signals x(t) and y(t) of FIG. 8. In the graph of FIG. 9, variable u is plotted along the abscissa and cross correlation function $R_{xy}$ is plotted along the ordinate. The cross correlation function $R_{xy}$ of FIG. 9 has the noise amplitude reduced, so that more accurate values of period $t_0$ and phase difference $t_1$ can be obtained in comparison with those of FIG. 8.

More specifically, the pitch $t_0$ of maximal points of cross correlation function $R_{xy}$ in FIG. 9 shows the length of 1 period of an interference light intensity signal. The range of variable u of cross correlation function $R_{xy}(u)$ is based on a range in which the region where x(t) and y(t) superimpose each other is integrated by convolution. More specifically, the region excluding the region where the values of the cross correlation function are 0 continuously is considered. The distance from the center of this region (in this case, 365 $\mu m \times 2 = 730$ $\mu m$) to the closest maximal point is $t_1$. Here, $t_1$ represents the moved amount of the optical wedge corresponding to a phase difference. By applying the obtained values of $t_1$ and $t_0$ of FIG. 9 into equation (14), a more accurate value can be obtained of the phase difference between light transmitted through phase shifting portion 3 and light transmitted through light transmitting portion 1b.

Embodiment 3

Another signal process is set forth in the following.

Figure 10:
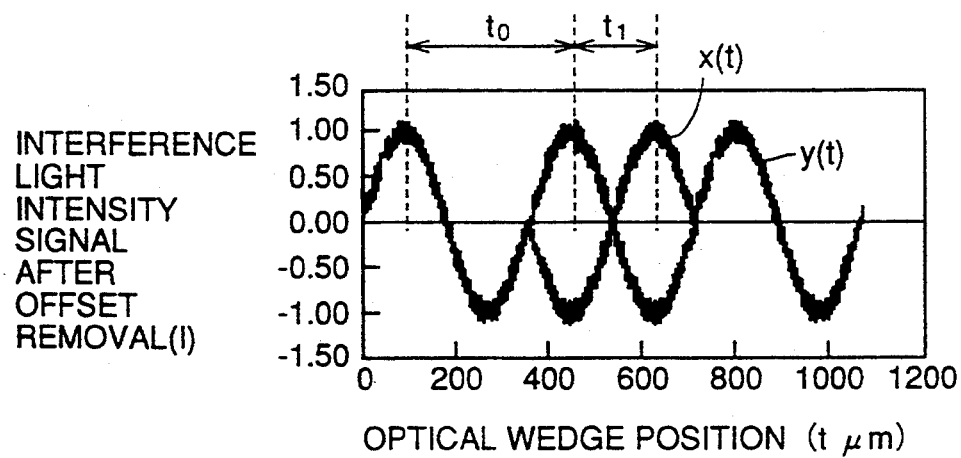
FIG. 10 is a graph showing two interference light intensity signals having different periods.

FIG. 10 is similar to the graph of FIG. 8, except that light intensity signal x(t) provided to computer 21 is limited to a range that is narrow by 2 periods in comparison with the other light intensity signal y(t). When light intensity signals x(t) and y(t) are obtained, the center point of the movement of optical wedge 15 is set to the same point.

Figure 11:
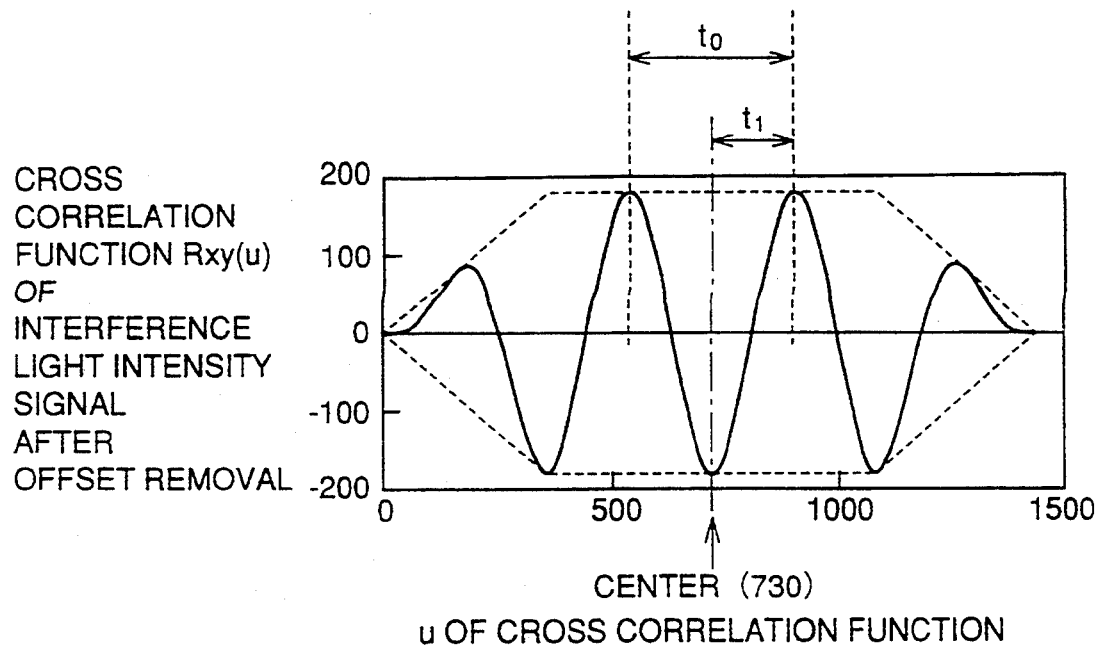
FIG. 11 is a graph showing a cross correlation function obtained from the two interference light intensity signals of FIG. 10.

FIG. 11 is similar to the graph of FIG. 9 provided that a cross correlation function $R_{xy}(u)$ is shown using light intensity signals x(t) and y(t) of FIG. 10. Because cross correlation function $R_{xy}$ of FIG. 9 is a cross correlation function operation of light intensity signals x(t) and y(t) of the same period length as shown in FIG. 8, the envelope connecting the maximal point and the minimal point of cross correlation function $R_{xy}$ forms a triangle respectively in the positive and negative regions. In this case, the maximal and minimal points of curve $R_{xy}$ have a tendency to shift slightly towards the center point (in this case 730 $\mu m$) of the cross correlation function. Therefore the values of period $t_0$ and phase difference $t_1$ obtained in FIG. 9 will be slightly lower than those of the actual light intensity signal x(t) and y(t).

In contrast, the cross correlation function $R_{xy}$ of FIG. 11 is obtained using the light intensity signals of FIG. 10, i.e. light intensity signal x(t) and a light intensity signal y(t) greater by 2 periods than light intensity signal x(t). The envelope of the cross correlation function shows a trapezoid in the respective positive and negative sides of $R_{xy}$. Because the maximal point and minimal point closest to the center of the cross correlation function are within a horizontal range of the envelope, the positions of these points will not be shifted towards the center. Therefore, the values of period $t_0$ and phase difference $t_1$ measured in FIG. 11 represents more accurate values of the period and phase difference of light intensity signals x(t) and y(t) of FIG. 10.

Embodiment 4

Further, it is possible to obtain a period of an interference intensity signal in advance and utilize a sine waveform signal as a reference signal which has been generated by calculation. More specifically, a phase difference is obtained between a light intensity signal having the two light beams transmitted through phase shifting portion 3 and light transmitting portion 1b interfered with each other, and a phase difference is obtained between a light intensity signal having the two light beams passing through light transmitting portion 1b interfered with each other and a reference signal, whereby the amount of phase shift of a phase shift portion 3 can be obtained indirectly on the basis of the reference signal. The cross correlation function is obtained by the reference signal and the actually measured light intensity signal whose length is at least 1 period.

Since a reference signal which is longer by 2 periods than the measured light intensity signal can be obtained easily by calculation, the actually measured light intensity signal should have a length of at least 1 wavelength when a cross correlation function as shown in FIG. 11 is to be obtained from a reference signal and an actually measured light intensity signal. This means that only the length of 1 period needs to be measured for a light intensity signal according to the two light beams transmitted through a phase shifting portion 3 and a light transmitting portion 1b and for a light intensity signal according to the two light beams transmitted through first and second light transmitting portions 1b. This gives the advantage of reducing the time required for measurement.

Embodiment 5

Figure 12:
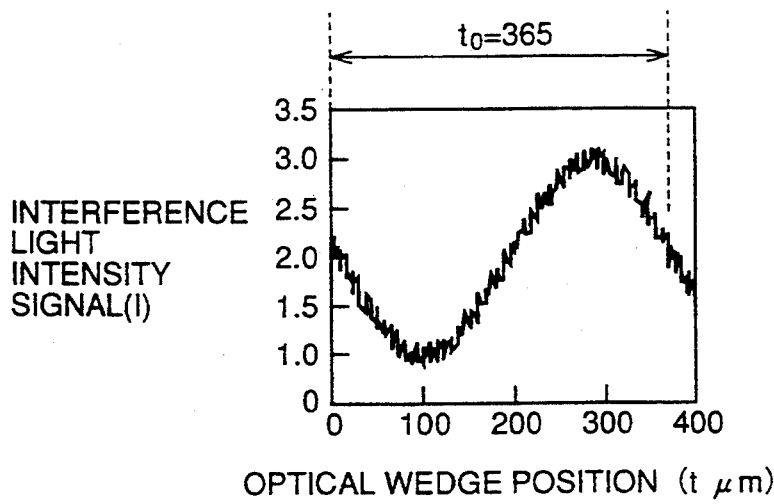
FIG. 12 is a diagram showing an interference light intensity signal having a length of a range wider by approximately 10% than one period.

When the position of the obtained maximal point is not correct since the amplitude of the obtained interference light intensity signal is too small to provide a sufficient SN ratio, the accuracy of detecting the amount of phase shift can be improved by a signal processing method using Fourier transform as set forth in the following. In this case, an interference light signal waveform is obtained according to an operation identical to that of using a cross correlation function. Regarding the range of movement of the optical wedge in retrieving interference light intensity signal waveforms x(t) and y(t), the optical wedge is moved by the same range as shown in FIG. 12. In this case, an interference beam signal waveform is fetched of a range that is approximately 10% greater than one period.

Next, a SINAD value is obtained for x(t) to find $t_0$. A SINAD value implies "signal/(noise + distortion)". When a signal of one period is to be dealt with, component of the first degree is the power of "signal" and the total sum of the components from the second to ninth degree is the power of "noise + distortion" in the power spectrum of a general signal. A value of this function is shown in FIG. 13.

Figure 13:
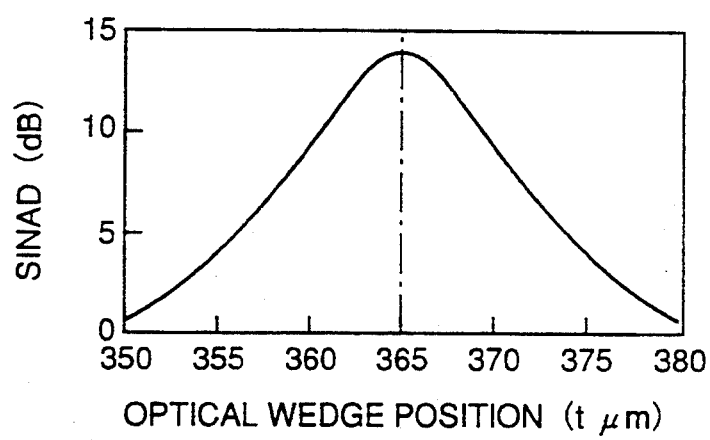
FIG. 13 is a diagram showing a SINAD value obtained for a period of approximately 1 period.
Figure 17A:
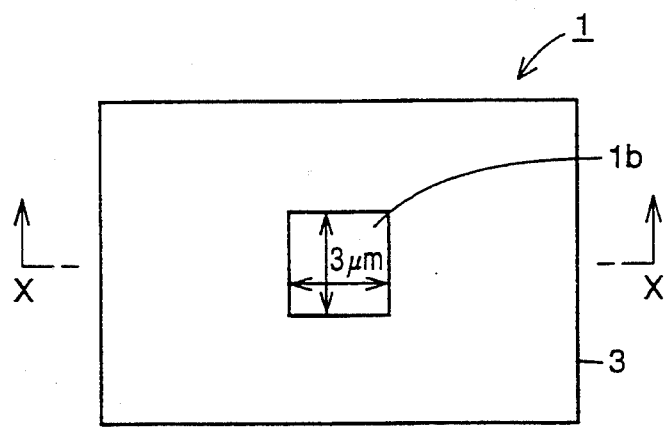
FIG. 17A is a plan view of an attenuation type phase shift mask with a light transmitting portion of 3 $\mu m\square$.
Figure 17B:
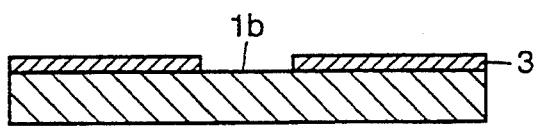
FIG. 17B is a sectional view taken in the direction of arrow X—X of FIG. 17A.

In FIG. 13, the position of the optical wedge is plotted along the abscissa, and the value of SINAD is plotted along the ordinate.

This method is based on the principle of aliasing noise being generated when the range of the Fourier transformed signal does not coincide with the period of the signal. When the Fourier transformed signal is sinusoidal, the range of the signal having a maximum SINAD value represents the period of the correct signal.

In the range of the period of the above-obtained signal, Fourier transform is applied for x(t) and y(t), and an angle and a vector length are simultaneously obtained in the polar coordinates of the found complex vector. Assuming that these angles are $\phi_1$ and $\phi_2$, the phase difference between a phase shifting portion and a light transmitting portion can be obtained by equation (4). Assuming that the vector length is respectively $B_1$ and $B_2$, light transmittance can be obtained by equation (13).

It is also possible to detect a fault in the testing apparatus by providing a determination standard of correct operation when the above-described SINAD value is greater than, for example, 10 (dB).

Embodiment 6

In the above embodiments, the phase difference in the phase shifting portion was obtained according to first and second light intensity signals in the case where light of a superimposed region of the transmitting regions of the phase shifting portion of light beam $11a'$ and the light transmitting portion of light beam $11b'$ is interfered with the light of a superimposed region of the transmitting regions of the light transmitting portion of light beam $11a'$ and the light transmitting portion of light beam $11b'$. In a similar manner, phase difference of a phase shifting portion can be obtained using a region 27 where the transmitting regions of phase shifting portion of light beam $11a'$ and the light transmitting portion of light beam $11b'$ are superimposed, and a region 29 where the transmitting regions of the light transmitting portion of light beam $11a'$ and the phase shifting portion of light beam $11b'$ are superimposed.

Embodiment 7

Figure 18:
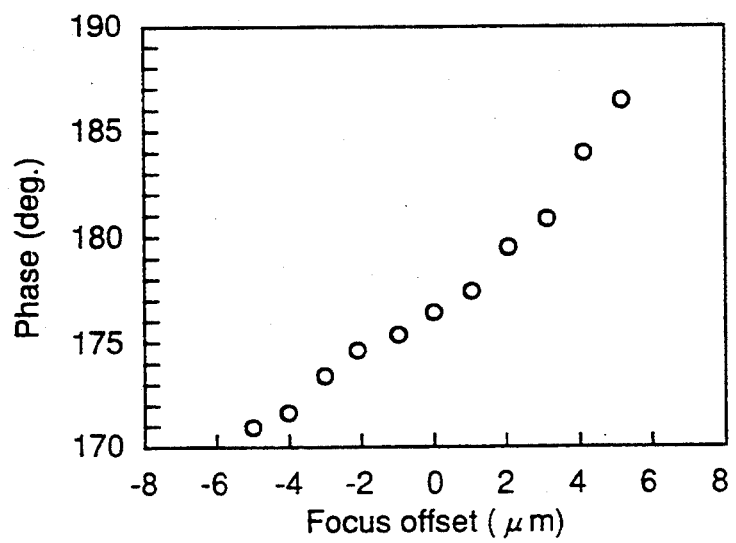
FIG. 18 shows the relationship between focus offset and phase difference in the measurement of the phase difference of an attenuation type phase shift mask.

Results of measuring the phase difference by varying the distance between an attenuation type phase shift mask and an objective lens are shown in FIG. 18 in the case where an attenuation type phase shift mask is tested in which light transmittance of the phase shifting portion 3 is 10% and one side of light transmitting portion $1b$ is a square pattern of 3 $\mu$m.

Figure 19:
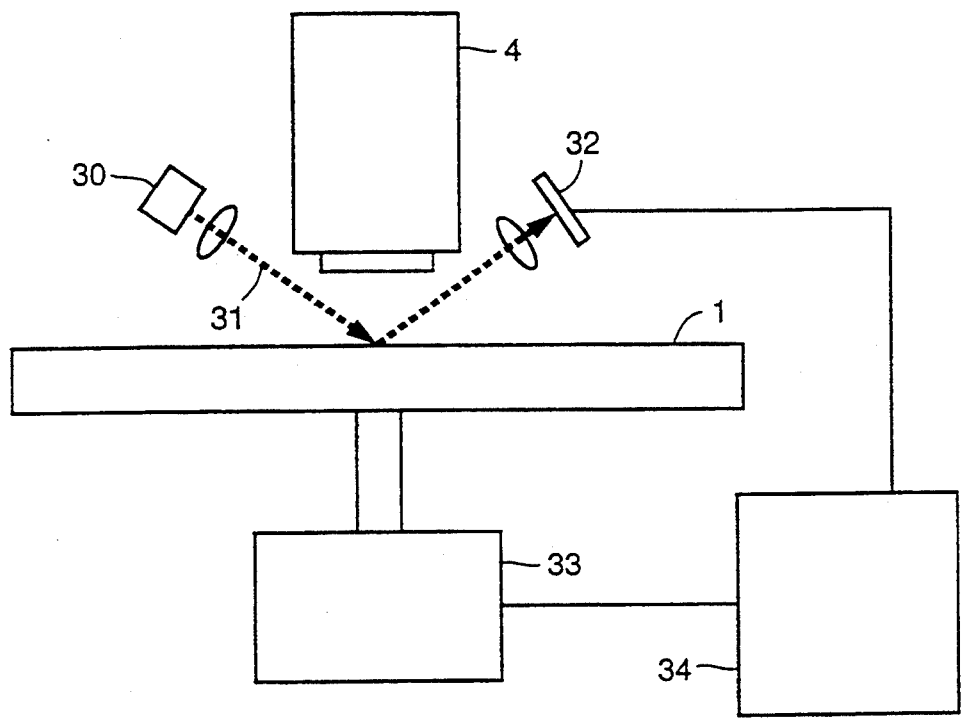
FIG. 19 is a first diagram showing a structure of an auto-focus mechanism.

In the case of a square pattern in which one side of light transmitting portion $1b$ is 3 $\mu$m, a measurement error of approximately 1° of the phase difference occurs for a focus offset of approximately 1 $\mu$m. An auto-focus mechanism as shown in FIG. 19 can be provided in the above-described embodiments to avoid this problem. Referring to FIG. 19, an apparatus is fixed at the outer side of the objective lens for measuring the distance between an objective lens 4 and an attenuation type phase shift mask 1. Error is fed back to the mechanism controlling the height of the attenuation type phase shift mask fixing stage, whereby the focusing position of the objective lens is directed at the attenuation type phase shift mask face in measuring the phase difference and transmittance. In operation, laser light 31 emitted from a laser light source 30 is reflected at the surface of attenuation type phase shift mask 1 to enter a light position sensor 32. The position of incident light into light position sensor 32 varies according to the height of attenuation type phase shift mask 1. The stage height is controlled by a driving mechanism 33 and a servo controller 34 so that the position of incident light is constant. By using the present method, focus adjustment error can be suppressed to less than 0.1 $\mu$m. From the data of FIG. 18, the phase difference measurement error can be suppressed to approximately 0.1° when light transmittance is 10% in the case of a square pattern where one side of the light transmitting portion is 3 $\mu$m.

Figure 20:
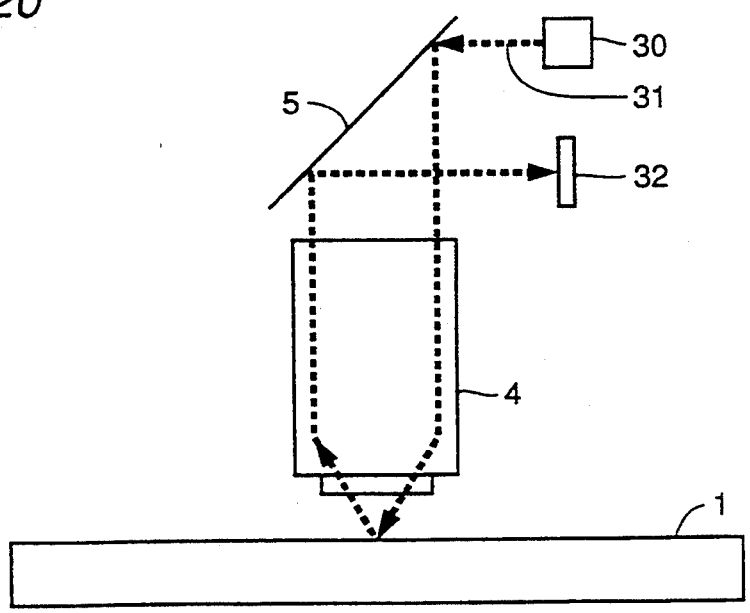
FIG. 20 is a second diagram showing a structure of an auto-focus mechanism.

Although the focusing lens uses in the above-described auto-focus mechanism to detect the height of the attenuation type phase shift mask was not an objective lens, but independent ones, an objective lens as shown in FIG. 20 may be used.

Embodiment 8

The light source used in the apparatus of FIG. 1 is not limited to a mercury lamp 25, and any light source that yields a sufficient amount of ultraviolet for measurement can be used. For example, a laser, a tungsten lamp, a halogen lamp, a xenon lamp, a deuterium lamp may be used.

Embodiment 9

In the above-described embodiments, the amount of phase shift of a phase shifter is measured using ultraviolet light having a wavelength identical to that used in an optical stepper. When a KrF excimer laser of a wavelength of 0.248 $\mu$m, for example, is used where sufficient intensity can not be obtained otherwise, the phase difference can be measured using a plurality of wavelengths (for example, 0.246 $\mu$m, 0.365 $\mu$m, 0.465 $\mu$m, 0.436 $\mu$m and 0.546 $\mu$m which are emissions of a mercury lamp). A phase difference of a wavelength of 0.248 $\mu$m of an excimer laser can be obtained by interpolation or extrapolation from the measured values. This method is useful because a KrF excimer laser, which can be used as a light source of an optical stepper, cannot be easily used as a light source of a testing apparatus shown in FIG. 1, since it is a pulse laser.

Embodiment 10

Although the measured position is observed by a television camera 19 for ultraviolet in the testing apparatus of FIG. 1, the measurement position may be visually observed via an ocular at the television camera 19 position using visible light only at the time of positioning phase shifting mask 1.

Embodiment 11

Figure 21:
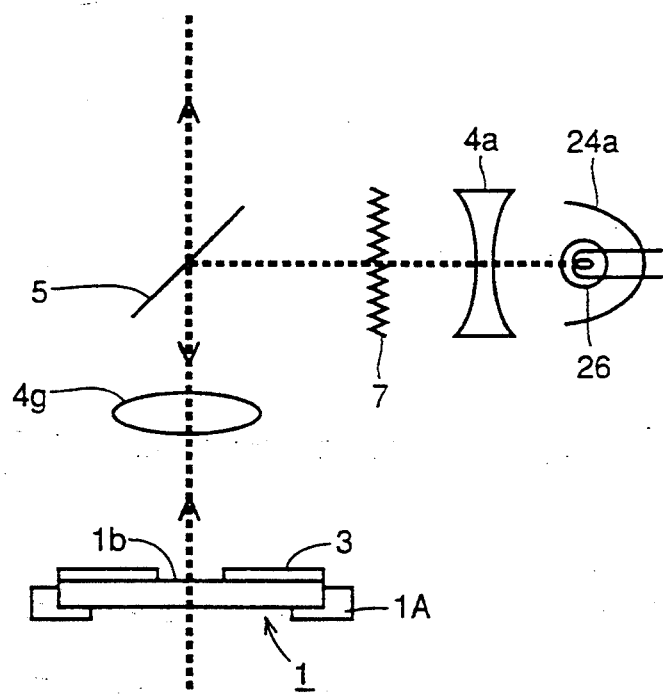
FIG. 21 schematically shows a reflectance type illumination system for positioning a phase shift mask.
Figure 22:
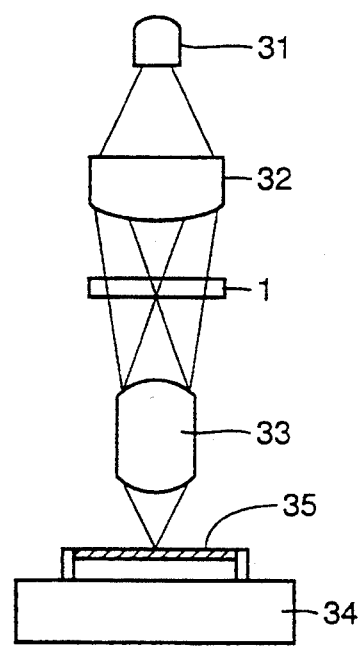
FIG. 22 is a diagram schematically showing the main components of an optical stepper.
Figures 25A, 25B, 25C, 25D, 25E:
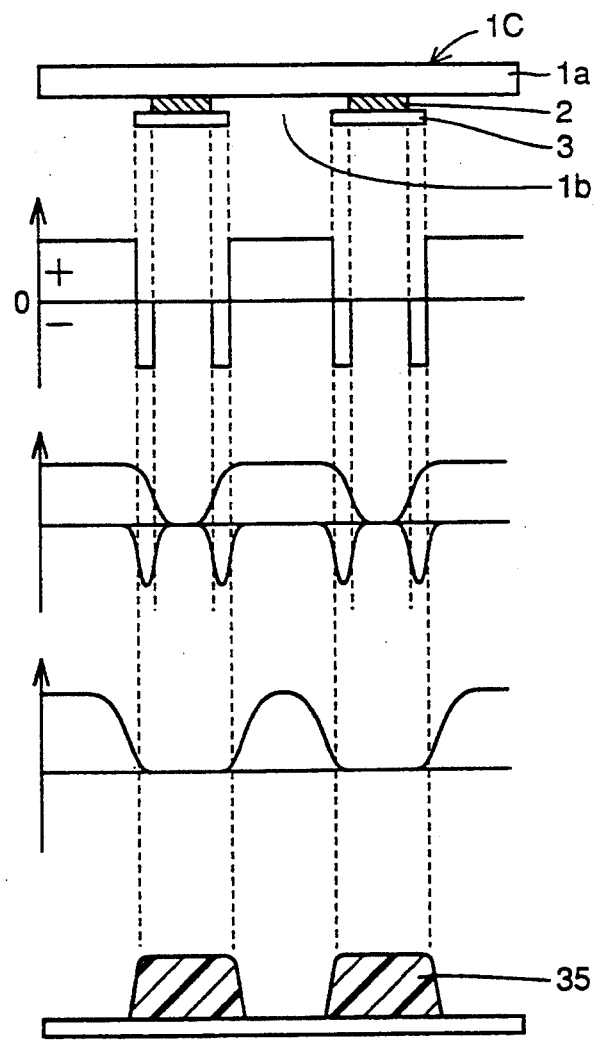
FIG. 25 shows a sectional view showing a structure of a phase shift mask (A); an electric field on a photomask using the phase shift mask of (A) (B); amplitude of light on a resist film using the phase shift mask of (A) (C); light intensity on a resist film using the phase shift mask of (A) (D); and a sectional view showing a pattern transferred onto a resist film using the phase shift mask of (A) (E).
Figure 27:
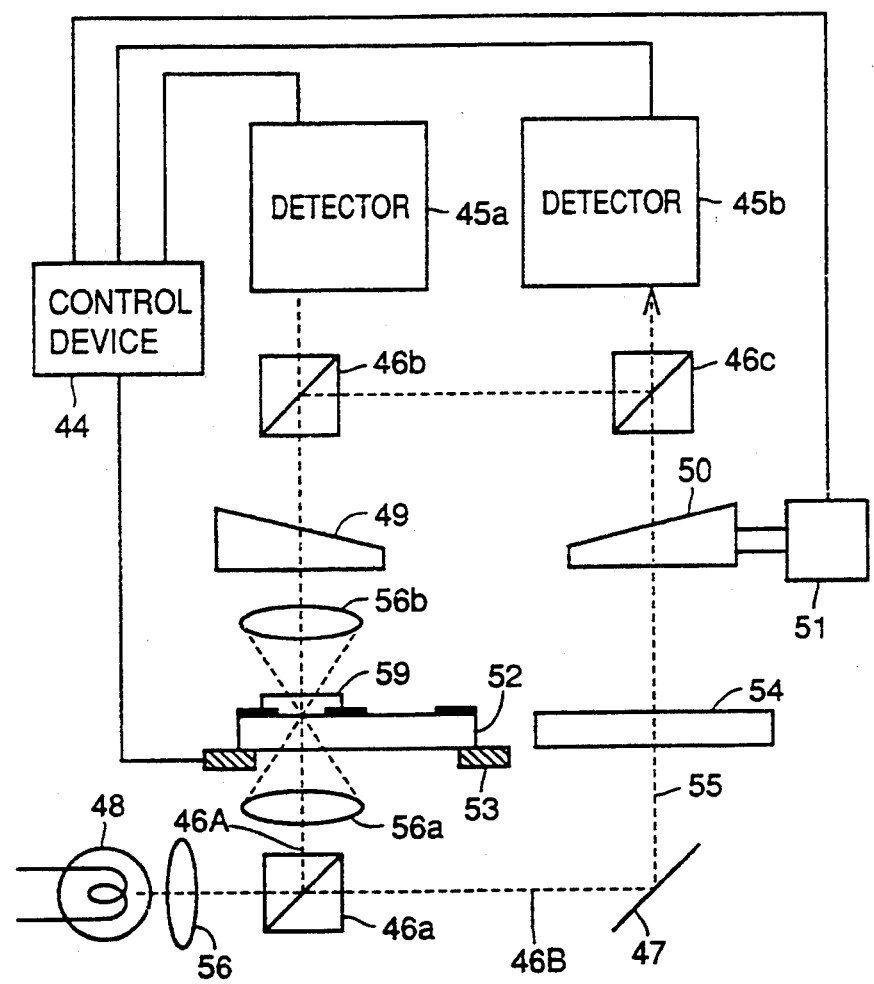
FIG. 27 is a block diagram showing a structure of a conventional phase shift mask testing apparatus.
Figure 28:
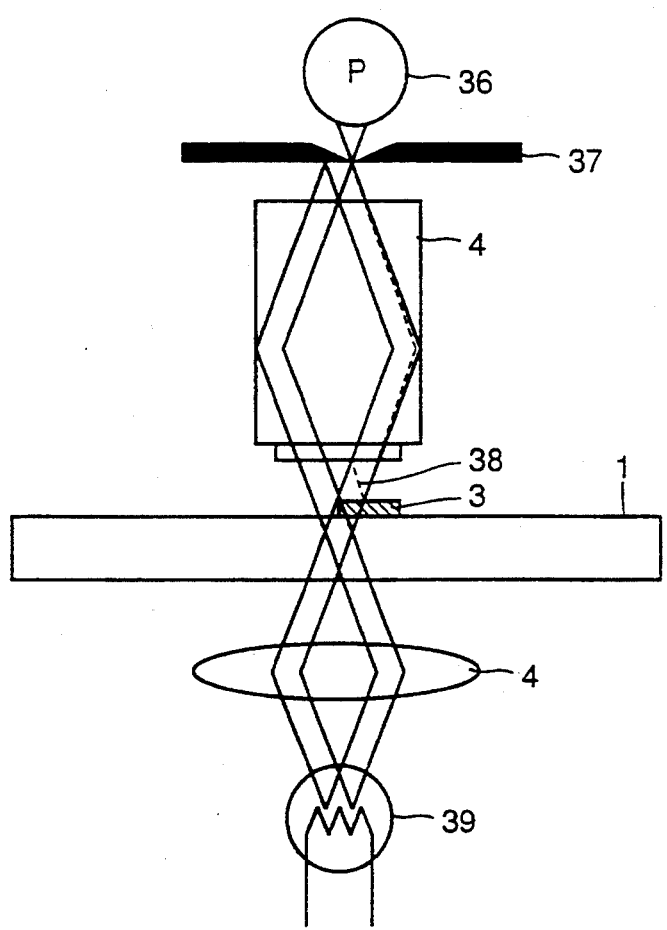
FIG. 28 is a schematic diagram showing influence of stray light in a micro region light transmittance measurement apparatus.
Figure 29:
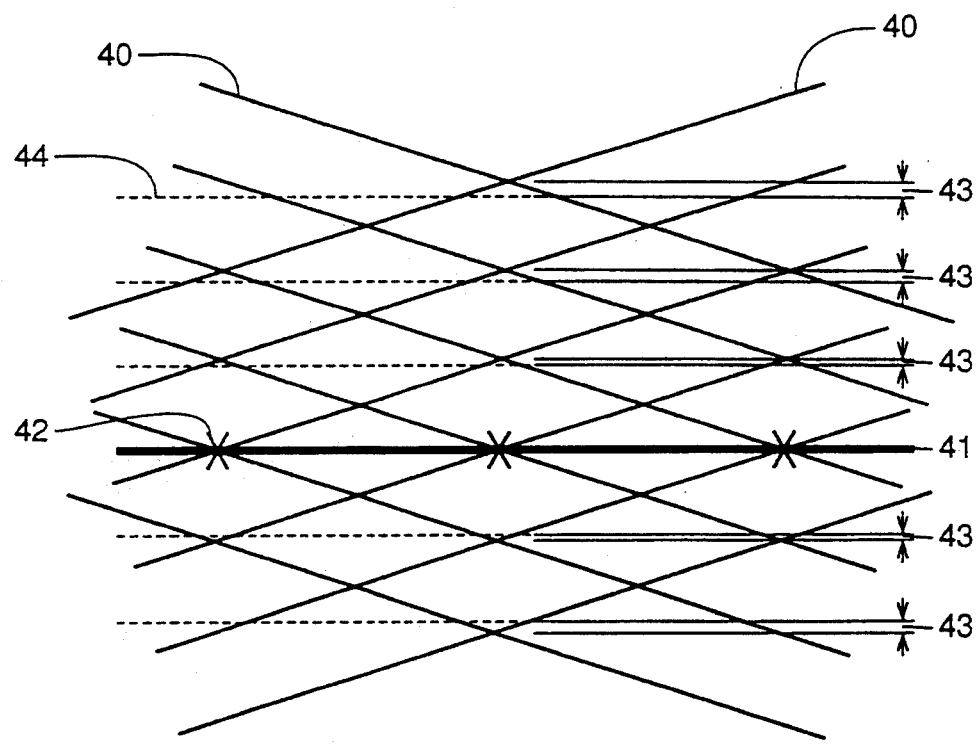
FIG. 29 schematically shows wavefront aberration by defocus.

As shown in FIG. 21, the measuring region may be observed with a reflection type illumination system in positioning a phase shift mask. In this case, a tungsten lamp 26 emitting sufficient visible light and a normal reflection mirror 24a can be used. The light from reflection mirror 24a is made parallel by a lens 4a, and then reflected towards a lens 4g by a half mirror 5. Lens 4g directs the light reflected by half mirror 5 into a phase shift mask 1. Light reflected from phase shift mask 1 passes through lens 4g and half mirror 5 to be observed by a user.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of testing a phase shift mask comprising the steps of:

directing ultraviolet light to a phase shift mask including a phase shifting portion and a light transmitting portion, diverging the ultraviolet light transmitted through said phase shift mask into a first light beam passing through a first optical path and a second light beam passing through a second optical path, generating a relative optical path length difference using an optical wedge between said first and second optical paths to superimpose said first and second light beams for forming an interference beam, positioning a photometric target at a region where transmiting regions of the phase shifting portion of said first light beam and the light transmitting portion of the second light beam of said interference beam are superimposed, measuring a first light intensity signal according to said interference beam depending upon change of said optical path difference by a first movement of said optical wedge using said photometric target, positioning said photometric target at a region where transmitting regions of the light transmitting portion of said first light beam and the light transmitting portion of the second light beam of said interference light are superimposed, measuring a second light intensity signal according to said interference light depending upon change in said optical path length difference by a second movement of said optical wedge using said photometric target, and obtaining optical characteristics of said phase shift mask according to said first and second light intensity signals.

2. The method of using a phase shift mask according to claim 1, wherein the step of obtaining optical characteristics of said phase shift mask comprises the steps of obtaining a first pitch ($t_1$) of maximal points of said first light intensity signal, obtaining a second pitch ($t_2$) of maximal points of said second light intensity signal, dividing said first pitch ($t_1$) by said second pitch ($t_2$), and multiplying that quotient by $2\pi$ to obtain an amount of phase shift ($\phi$) of said phase shifting portion.

3. The method of testing a phase shift mask according to claim 1, wherein said step of obtaining optical characteristics of said phase shift mask comprises the steps of obtaining a first interference light intensity amplitude ($B_1$) of said first light intensity signal, obtaining a second interference light intensity amplitude ($B_2$) of said second light intensity signal, dividing said first interference light intensity amplitude ($B_1$) by said second interference light intensity amplitude ($B_2$), multiplying this quotient by itself, and multiplying this squared value by a light transmittance ($t_2$) of said light transmitting portion to obtain a light transmittance (T) of said phase shifter.

4. The method of testing a phase shift mask according to claim 1, wherein said step of measuring said second light intensity signal has said second movement of said optical wedge within a range smaller by at least 2 periods with respect to said first movement, wherein said step of obtaining optical characteristics of said phase shift mask comprises the steps of obtaining a cross correlation function of said first and second light intensity signals, obtaining a period of said light intensity signal according to the distance between a first maximal point most closest to the center point of said cross correlation function and a second maximal point next closest to said center point, and obtaining an amount of phase shift of said phase shifting portion from said first and second light intensity signals by dividing the distance between said center point and said first maximum point by said center period, and multiplying this quotient by $2\pi$.

5. A method of testing a phase shift mask comprising the steps of:

directing ultraviolet light to a phase shift mask including a phase shifting portion and a light transmitting portion, diverging the ultraviolet light transmitted through said phase shift mask into a first light beam passing through a first optical path and a second light beam passing through a second optical path, generating a relative optical path length difference using an optical wedge between said first and second optical paths to superimpose said first and second light beams for forming an interference beam, positioning a photometric target at a region where transmitting regions of the phase shifting portion of said first light beam and the light transmitting portion of the second light beam of said interference beam are superimposed, measuring a first light intensity signal according to said interference beam depending upon change of said optical path difference by a first movement of said optical wedge using said photometric target, positioning said photometric target at a region where transmitting regions of the light transmitting portion of said first light beam and the phase shifting portion of the second light beam of said interference light are superimposed, measuring a second light intensity signal according to said interference light depending upon change in said optical path length difference by a second movement of said optical wedge using said photometric target, and obtaining optical characteristics of said phase shift mask according to said first and second light intensity signals.

6. A method of testing a phase shift mask comprising the steps of:

directing ultraviolet light to a phase shift mask including a phase shifting portion and a light transmitting portion, diverging the ultraviolet light transmitted through said phase shift mask into a first light beam passing through a first optical path and a second light beam passing through a second optical path, generating a relative optical path length difference using an optical wedge between said first and second optical paths to superimpose said first and second light beams for forming an interference beam, positioning a photometric target at a region where transmitting regions of the phase shifting portion of said first light beam and the light transmitting portion of the second light beam of said interference beam are superimposed, using said photometric target, driving said optical wedge more than 1 wavelength to measure a first light intensity signal depending upon the change of said optical path length difference, carrying out Fourier transform on said first light intensity signal when the length of said first light intensity signal is varied within a range of approximately 1 wavelength to measure a first power spectrum, obtaining a first SN ratio by said first power spectrum, carrying out Fourier transform for the range of the period of said first light intensity signal by obtaining the maximal point of said first SN ratio to obtain a first angle ($\phi_1$) and a first vector length ($B_1$) in the polar coordinates of the obtained first complex vector, positioning said photometric target at a region where transmitting regions of the light transmitting portion of said first light beam and the light transmitting portion of said second light beam of said interference light are superimposed, using said photometric target, driving said optical wedge at least by 1 wavelength to measure a second light intensity signal according to said interference light depending upon change in said optical path length difference, carrying out Fourier transform on said second light intensity signal when the length of said second light intensity signal is varied within the range of approximately 1 wavelength to measure a second power spectrum, obtaining a second SN ratio by said second power spectrum, carrying out Fourier transform for the range of the period of said second light intensity signal by obtaining a maximum point of said second SN ratio to obtain a second angle ($\phi_2$) and a second vector length ($B_2$) in the polar coordinates of the obtained second complex vector, obtaining an amount of phase shift ($\phi$) of said phase shifting portion by the difference between said first and second angles ($\phi_1$ and $\phi_2$), dividing said first vector length ($B_1$) by the second vector length ($B_2$), and multiplying that quotient by itself, and multiplying the squared value by a light transmittance ($T_2$) of said light transmitting portion to obtain a light transmittance of said phase shifting portion.

7. A apparatus for testing a phase shift mask comprising:

a light source for emitting ultraviolet light, phase shift mask supporting means including a phase shifting portion and a light transmitting portion for supporting a phase shift mask through which said ultraviolet light passes, ultraviolet light diverging means for diverging said ultraviolet light passing through said phase shift mask into a first light beam passing through a first optical path and a second light beam passing through a second optical path, superimposing means for superimposing said first and second light beams to form an interference beam, and testing means for testing optical characteristics of said phase shift mask by optical characteristics of said interference light, wherein, in said first and second optical paths are provided optical path length adjusting means for adjusting relative relationship between the length of said first optical path and the length of said second optical path, and shearing means for generating a predetermined deviation between a pattern image of said phase shift mask of said first light beam and a pattern image of said phase shift mask of said second light beam at the superposition between said first and second light beams.

* * * * *